(12) United States Patent
Wang et al.

(10) Patent No.: US 7,647,210 B2
(45) Date of Patent: Jan. 12, 2010

(54) PARAMETRIC MODELING METHOD AND SYSTEM FOR CONCEPTUAL VEHICLE DESIGN

(75) Inventors: Nanxin Wang, Novi, MI (US); Jian Wan, Novi, MI (US); Gianna Gomez-levi, Ann Arbor, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 283 days.

(21) Appl. No.: 11/276,234

(22) Filed: Feb. 20, 2006

(65) Prior Publication Data

US 2007/0198230 A1    Aug. 23, 2007

(51) Int. Cl.
*G06F 17/50* (2006.01)
(52) U.S. Cl. .................. 703/1; 703/8; 345/441; 345/619
(58) Field of Classification Search .............. 703/1
See application file for complete search history.

(56) References Cited

U.S. PATENT DOCUMENTS

| | | | |
|---|---|---|---|
| 5,237,250 A | 8/1993 | Zeile et al. | |
| 5,384,704 A | 1/1995 | Snyder et al. | |
| 5,774,969 A | 7/1998 | Zuccato | |
| 6,324,750 B1 | 12/2001 | Saunders et al. | |
| 6,371,766 B1 | 4/2002 | Doll et al. | |
| 6,760,693 B1* | 7/2004 | Singh et al. | 703/8 |
| 7,079,114 B1 | 7/2006 | Smith et al. | |
| 7,295,959 B2* | 11/2007 | Noma et al. | 703/8 |
| 7,440,877 B2* | 10/2008 | Smith et al. | 703/2 |
| 2003/0011561 A1 | 1/2003 | Stewart et al. | |
| 2003/0055674 A1 | 3/2003 | Nishiyama | |
| 2003/0132968 A1 | 7/2003 | Stewart et al. | |
| 2004/0148145 A1 | 7/2004 | Chen et al. | |
| 2005/0096885 A1 | 5/2005 | Rhodes et al. | |
| 2005/0200623 A1 | 9/2005 | Smith et al. | |
| 2006/0025983 A1 | 2/2006 | Arbitter et al. | |
| 2006/0038812 A1 | 2/2006 | Warn et al. | |
| 2006/0038832 A1 | 2/2006 | Smith et al. | |
| 2006/0155402 A1 | 7/2006 | Read | |

OTHER PUBLICATIONS

Aleixos et al, "Integrated Modeling with Top-Down Approach in Subsidiary Industries", Computers in Industry, vol. 53, pp. 97-116, 2004.*

Calkins, D.E., Egging, N. Scholz, C. and Gomez-Levi, G.: AutoDSS: A System Level KBE Tool for Vehicle Product Definition, SAE 2000-01-1351, Mar. 6-9, 2000.

Bhise, V., Kridli G., Mamoola, H., Devaraj, S., Pillari, A., Shulze, R.: Development of a Parametric Model for Advanced Vehicle Design, SAE 2004-01-0381, Mar. 8-11, 2004.

(Continued)

*Primary Examiner*—Paul L Rodriguez
*Assistant Examiner*—Mary C Jacob
(74) *Attorney, Agent, or Firm*—Raymond Coppiellie; Brooks Kushman P.C.

(57) ABSTRACT

An electronic method for parametric modeling of a conceptual vehicle design. The method includes (a) receiving dimensional input including one or more vehicle level parameters and one or more component level parameters; (b) receiving geometrical input including one or more non-dimensional design inputs; and (c) generating a parametric concept model based on dimensional input and the geometrical input.

16 Claims, 13 Drawing Sheets

OTHER PUBLICATIONS

Wang, N., Becker, B., and Kaepp, G.: PEDSS: A Product Engineering Decision Support System, Proceedings of IMECE 2000, Florida, 2000.

Wang, N., Wan, J., and Gomez-Levi, G.: A Parametric Approach to Vehicle Seating Buck Design, ASME DETC2004-57212, Sep. 28-Oct. 2, 2004.

Wang, N., Wan, J., and Gomez-Levi, G.: Parametric Method for Applications in Vehicle Design, SAE 05B-201, accepted by SAE World Congress, Apr. 2005.

"Motor Vehicle Dimensions", SAE International, Surface Vehicle Recommended Practice, J1100, Revised Jul. 2002, 68 pages.

* cited by examiner

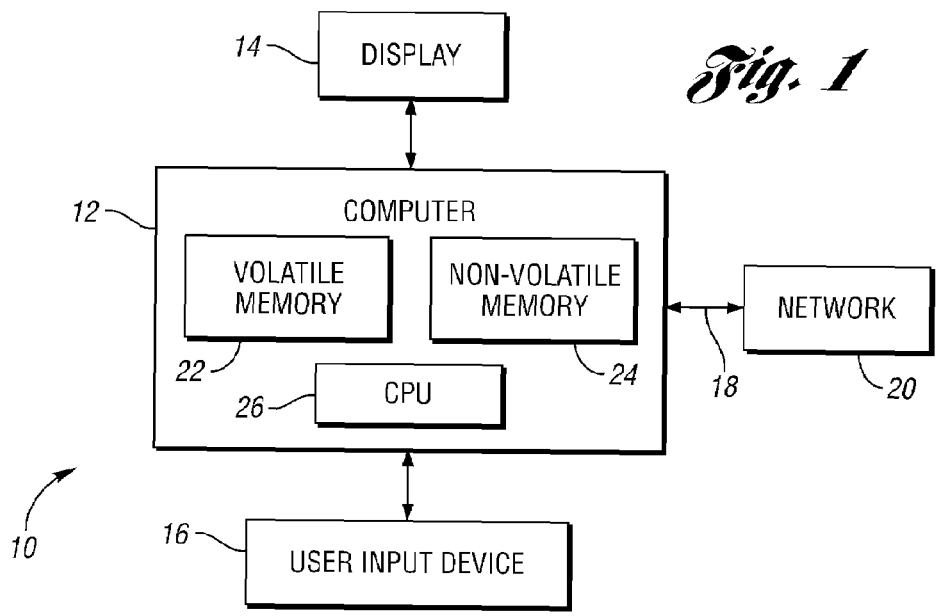
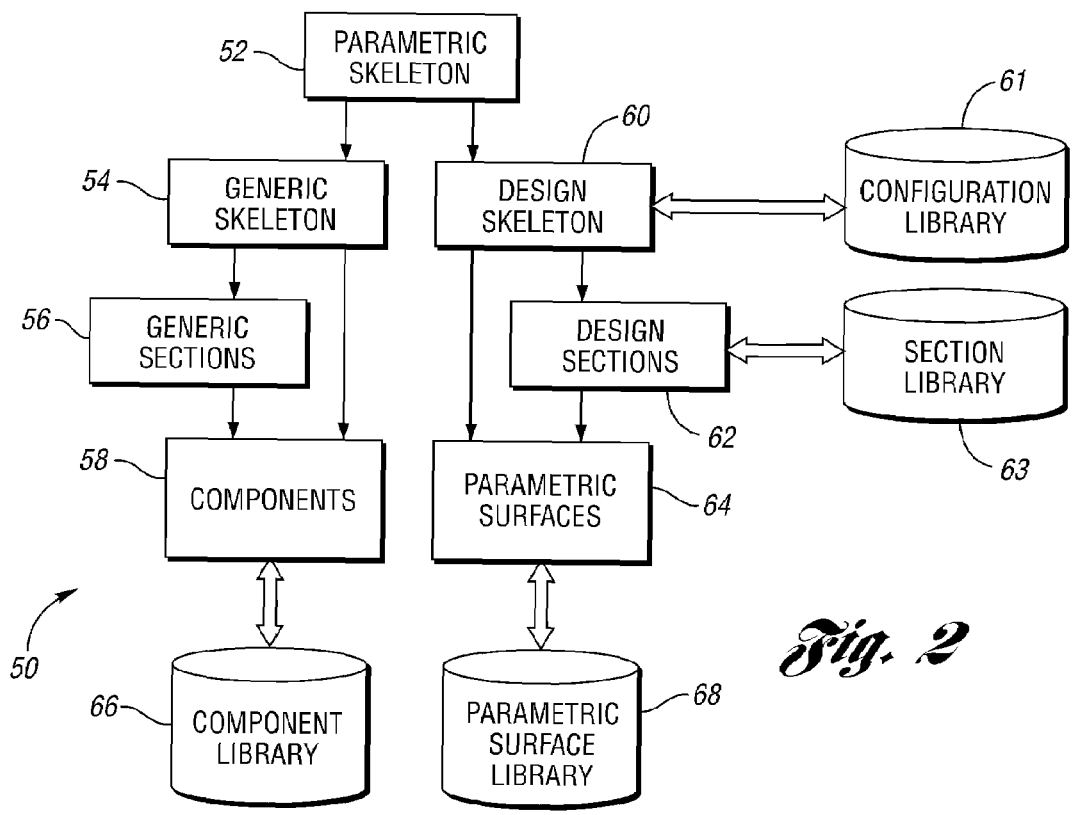

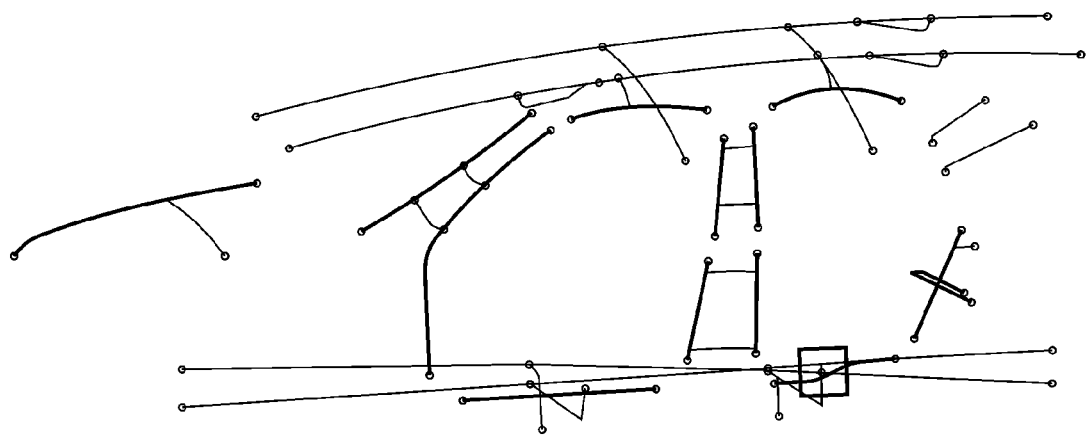
Fig. 8
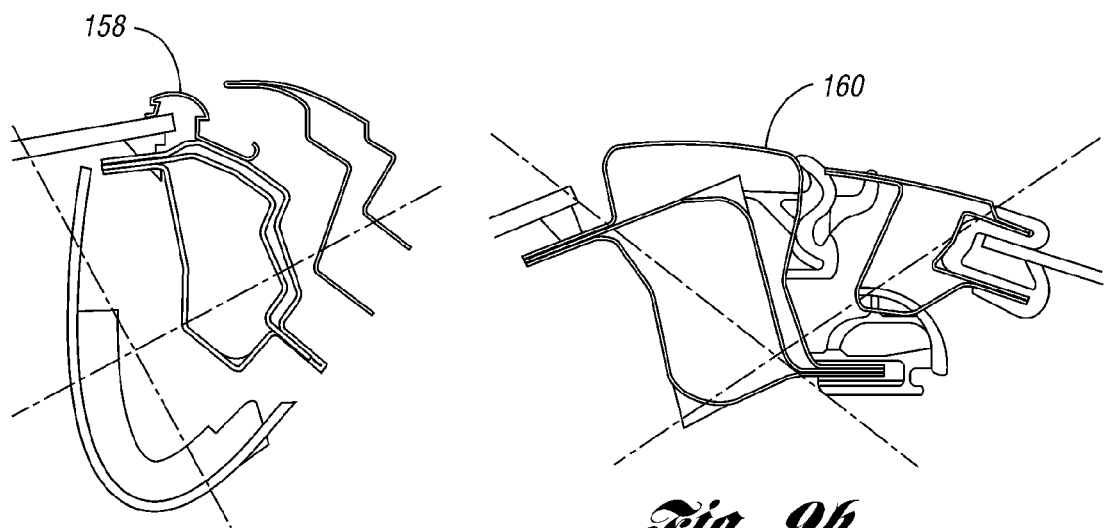
Fig. 9a
Fig. 9b
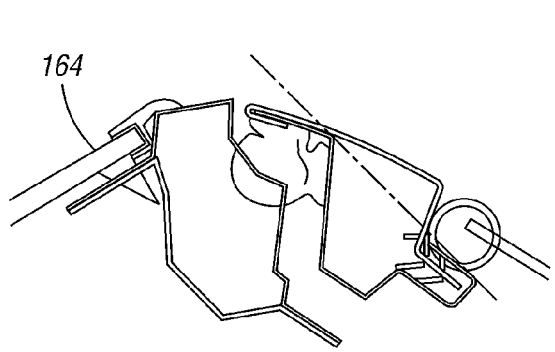
Fig. 9c
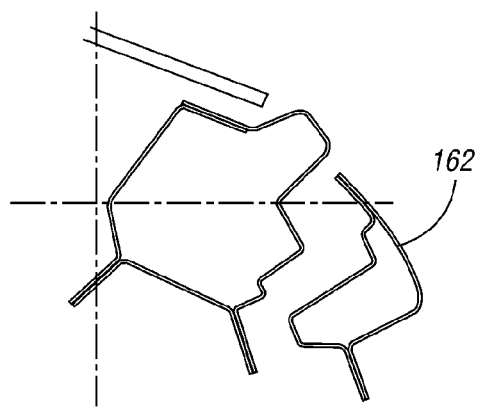
Fig. 9d

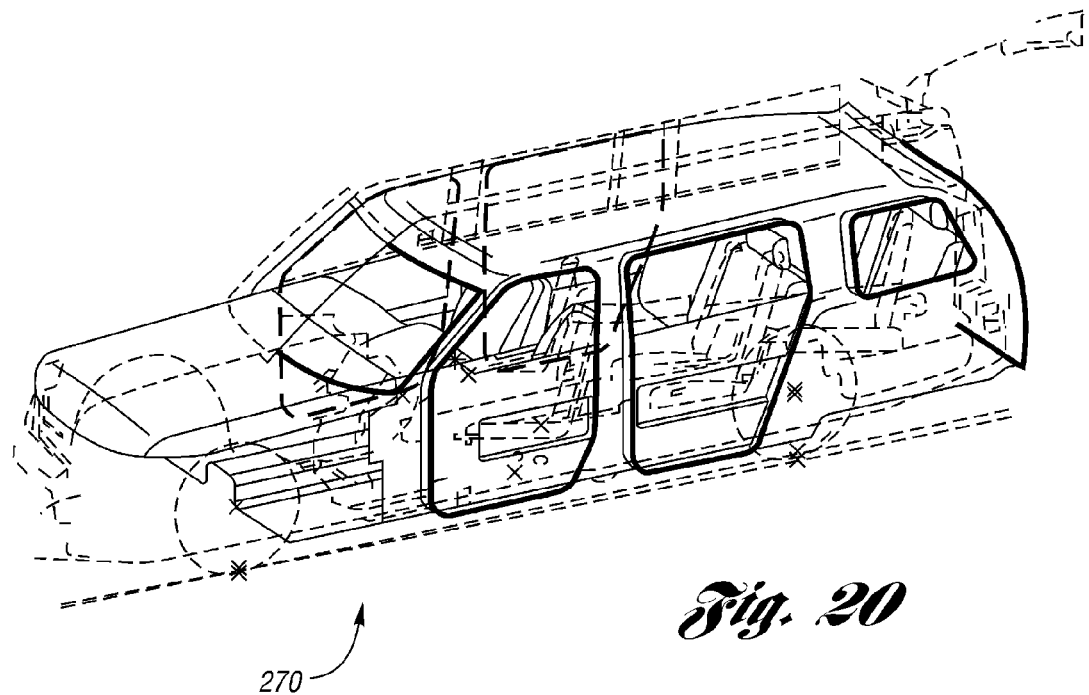

Fig. 20

| Proportion Dimensions | | | | | |
|---|---|---|---|---|---|
| SAE# | SAE Name | Target | Desired | Current | Conf. |
| L101 | Wheelbase | | 2769.37 | 2769.37 | ☐ |
| L103 | Vehicle Length | | 4154.0 | 4154.0 | ☐ |
| W103 | Vehicle Width, Maximum | | 1964.0 | 1964.0 | ☐ |
| W104 | Vehicle Width including mir... | | 1700.0 | 1700.0 | ☐ |
| H101 | Overall Height at Curb | | 1418.0 | 1418.0 | ☐ |
| H122 | Windchield Slope Angle | | 57.62 | 57.62 | ☐ |
| H121 | Bachlight Slope Angle | | 51.32 | 51.32 | ☐ |
| A122 | Tumble Home | | 25.32 | 25.32 | ☐ |
| L125 | Cowl Point X Coordinate | | 1995.0 | 1995.0 | ☐ |
| H114 | Cowl Point z Coordinate | | 1025.32 | 1025.32 | ☐ |
| H138 | Deck Point z Coordinate | | 1114.31 | 1114.31 | ☐ |
| L128 | Front Wheel Centerline X C... | | 1746.0 | 1746.0 | ☐ |
| L127 | Rear Wheel Centerline X Co... | | 4361.0 | 4361.0 | ☐ |
| H136 | Zero Z Plane to Ground - Fr... | | 196.0 | 196.0 | ☐ |
| H137 | Zero Z Plane to Ground - Re... | | 212.0 | 212.0 | ☐ |

Fig. 21

PARAMETRIC MODELING METHOD AND SYSTEM FOR CONCEPTUAL VEHICLE DESIGN

BACKGROUND OF THE INVENTION

1. Field of the Invention

One aspect of the present invention generally relates to a parametric modeling method and system for conceptual vehicle design.

2. Background Art

Early conceptual design is an important stage in vehicle product development. At this stage, various iterations of design, analysis, validation and confirmation are typically carried out with limited and constantly changing vehicle design information, thereby complicating engineering decisions.

To overcome these complications, computer aided design (CAD) tools have been developed to aid in conceptual vehicle design. Many CAD tools include functionality to rapidly create various parametric concept models. Coarse vehicle geometry can be generated, allowing for an increased number of design iterations at an early stage in the development process, thereby reducing the time per design iteration.

However, challenges still exist. For instance, building a parametric vehicle model that is flexible and robust while maintaining adequate accuracy is a challenge. A classical trade off exists between flexibility and accuracy. Accuracy is needed so that the parametric vehicle model represents the main characteristics of a new vehicle design. In certain cases, the accuracy of the parametric vehicle model can be enhanced if more detailed features are included, which can increase the complexity of the model and the chances of updating failure during design changes. On the other hand, flexibility comes from the simplicity of the parametric vehicle model. Simplicity may reduce the possibility of having detailed features in the model. However, if the model is over simplified, it may decrease the ability to simulate the vehicle design and introduce more errors into the design evaluation. Keeping the balance between flexibility and accuracy is a constant challenge in parametric concept modeling.

In light of the foregoing, a parametric modeling method and system is needed to generate and manipulate a vehicle concept model for early vehicle design. A method and system are also needed to improve the flexibility and robustness of a parametric concept model, thereby allowing for easy modifications of the model based on limited dimensional and geometrical input.

SUMMARY OF THE INVENTION

One aspect of the present invention is a parametric modeling method for generating a conceptual vehicle design that is easily modifiable for a wide range of design changes, including vehicle configuration changes, vehicle and component changes, and styling changes. Another aspect of the present invention is a method for parametric modeling that allows a parametric model to be more reliable when updated based on various design changes.

Yet another aspect of the present invention is the ability to generate and manipulate a parametric vehicle concept model for use in the early stages of a vehicle design process.

According to one embodiment of the present invention, the vehicle concept model includes two skeletons: a generic skeleton and a design skeleton (FIG. 2). These skeletons can share the same set of information in the global control layer of FIG. 3. Both the generic and design skeletons can be adjusted by dimensional or geometric input for given vehicle size, proportion, and/or configuration. The generic skeleton is used to position and/or orient components and/or interior systems (e.g. seats, steering wheels, etc.). The design skeleton is used to generate design or parametric surfaces. The generic skeleton has control points, axis systems and control lines to position and orient components, and coarse control curves that are used to approximate geometric input, e.g., door openings, for the positioning of components like pillars and rockers. The design skeleton, on the other hand, has more detailed parametric control curves that are used to represent the geometric input for the creation of parametric surfaces, e.g., A-pillar surface following both the windshield opening curve and the front door opening curve. Varying the information in the global control layer results in the reposition and/or reorientation of components assembled to the generic skeleton (rigid body movement in the space), and updating or regenerating of parametric or design surfaces governed by the design skeleton.

The introduction of the generic skeleton enables easy reuse of legacy components (from previous design or benchmarking design). The coexistence of both generic and design skeleton makes it possible to mix and match the new design with the old (or carry over, or benchmark) for creating an optimal design. This is accomplished by creating new components using the surfaces generated in the design skeleton and assembling them together with the legacy components in the generic skeleton.

According to an embodiment of the present invention, an electronic method for parametric modeling of a conceptual vehicle design is disclosed. The method includes (a) receiving dimensional input including one or more vehicle level parameters and one or more component level parameters; (b) receiving geometrical input including one or more non-dimensional design inputs; and (c) generating a parametric concept model based on dimensional input and the geometrical input.

According to another embodiment of the present invention, an electronic method for parametric modeling of a conceptual vehicle design is disclosed. The method includes (a) receiving dimensional input and geometrical input; and (b) generating a parametric skeleton based on the dimensional input and geometrical input. The parametric skeleton can be relied upon to generate a parametric concept model.

According to yet another embodiment of the present invention, a computer system is disclosed. The computer system includes a computer having a central processing unit (CPU) for executing machine instructions and a memory for storing machine instructions that are to be executed by the CPU is disclosed. The machine instructions when executed by the CPU implement the following functions: (a) receiving dimensional input and geometrical input; and (b) generating a parametric skeleton based on the dimensional input and geometrical input. The parametric skeleton can be relied upon to generate a parametric concept model.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompanying drawings which:

FIG. 1 is an example of a computer system according to one embodiment of the present invention;

FIG. 2 is an example of the schematic of a parametric skeleton according to one embodiment of the present invention;

FIG. 8 illustrates a number of parametric sections located in a skeleton model according to one embodiment of the present invention;

FIGS. 9a, 9b, 9c and 9d illustrate a number of A-pillar section topologies according to one embodiment of the present invention;

FIG. 20 illustrates an example of a model having parametric surfaces based on a design skeleton according to one embodiment of the present invention; and FIG. 21 is a graphical user interface (GUI) for inputting and modifying one or more vehicle level parameters according to one embodiment of the present invention.

DETAILED DESCRIPTION OF EMBODIMENTS OF THE PRESENT INVENTION

Figure 3:
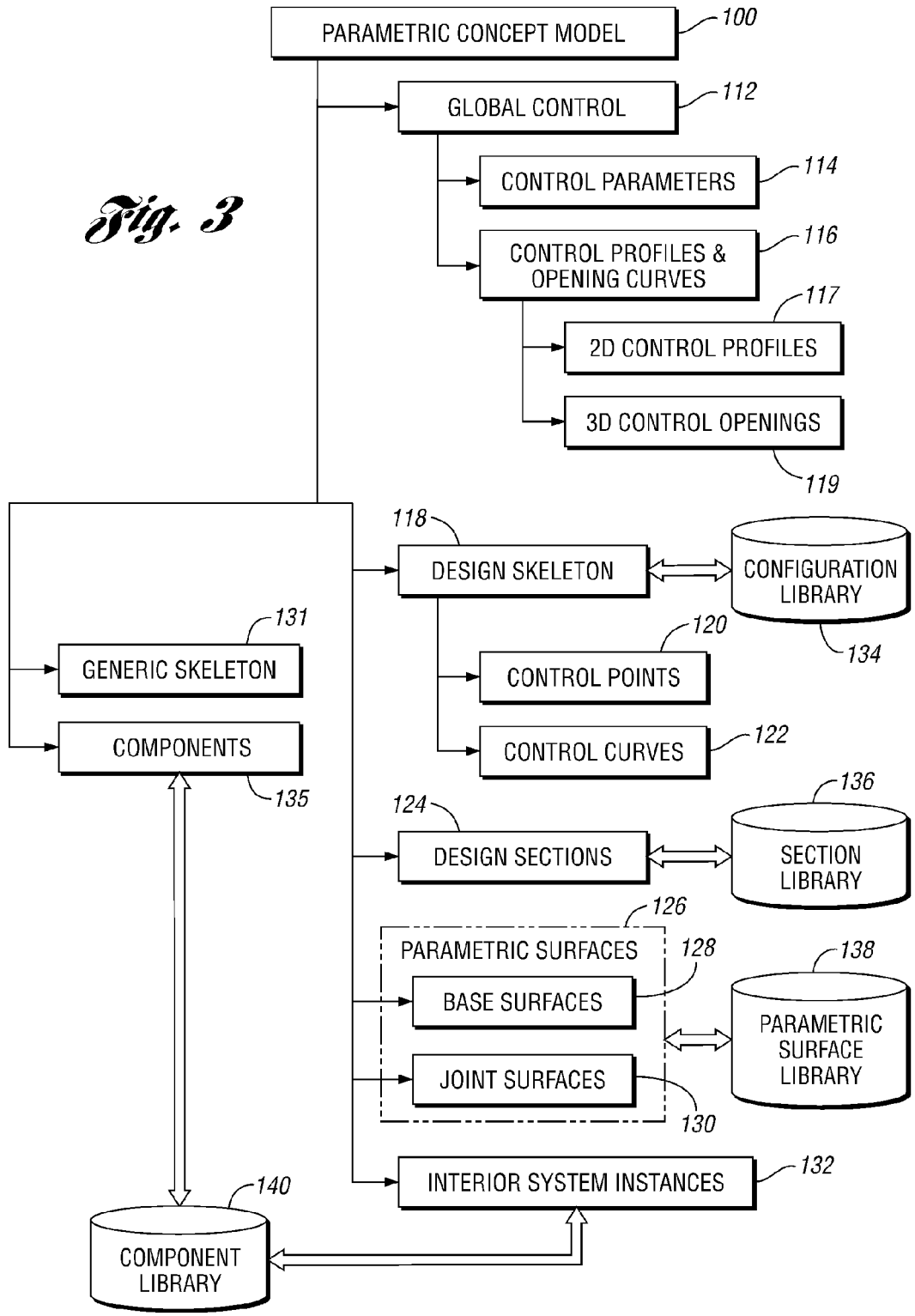
FIG. 3 is a parametric concept modeling architecture according to one embodiment of the present invention.

FIG. 1 depicts an environment, computer system 10, suitable for implementing one or more embodiments of the present invention. Computer system 10 includes computer 12, display 14, user interface 16, communication line 18 and network 20.

Computer 12 includes volatile memory 22, non-volatile memory 24 and central processing unit (CPU) 26. Non-limiting examples of non-volatile memory include hard drives, floppy drives, CD and DVD drives, and flash memory, whether internal, external, or removable. A database can reside in non-volatile memory 24. Volatile memory 22 and/or non-volatile memory 24 can be configured to store machine instructions. CPU 26 can be configured to execute machine instructions to implement functions of the present invention, for example, parametric modeling for conceptual vehicle design.

Display 14 can be utilized by the user of the computer 12 to view, edit, and modify data relating to parametric modeling for conceptual vehicle design. A non-limiting example display 14 is a color display, e.g. a liquid crystal display (LCD) monitor or cathode ray tube (CRT) monitor.

The user input device 16 can be utilized by a user to input instructions to be received by computer 12. The user input device 16 can be a keyboard having a number of input keys, a mouse having one or more mouse buttons, a touchpad or a trackball or combinations thereof. In certain embodiments, the mouse has a left mouse button and a right mouse button. It will be appreciated that the display 14 and user input device 16 can be the same device, for example, a touch-sensitive screen.

Computer 12 can be configured to be interconnected to network 20, the rough communication line 18, for example, a local area network (LAN) or wide area network (WAN), through a variety of interfaces, including, but not limited to dial-in connections, cable modems, high-speed lines, and hybrids thereof. Firewalls can be connected in the communication path to protect certain parts of the network from hostile and/or unauthorized use.

Computer 12 can support TCP/IP protocol which has input and access capabilities via two-way communication lines 18. The communication lines can be an intranet-adaptable communication line, for example, a dedicated line, a satellite link, an Ethernet link, a public telephone network, a private telephone network, and hybrids thereof. The communication lines can also be intranet-adaptable. Examples of suitable communication lines include, but are not limited to, public telephone networks, public cable networks, and hybrids thereof.

According to certain embodiments of the present invention, a parametric concept model can be generated based on vehicle input. Additionally, the model can be manipulated based on design changes. The parametric concept model can be CAD data file representing the model. The CAD data file can be stored in a database, for example, a database residing in non-volatile memory 24. CPU 26 can execute machine instructions for generating a graphical image from the CAD data for display on display 14.

The parametric concept model and associated methods of the present invention can be used to capture and store the movement of a vehicle buck. Moreover, the parametric concept model can include data originating from studio designs. Moreover, the parametric concept model and associated methods can be used to design the surfaces of a specific vehicle.

In certain embodiments, two sets of geometries, otherwise referred to as skeletons, are utilized in association with a parametric skeleton 52, as shown on flowchart 50 of FIG. 2, for generating and manipulating a parametric concept model. The generic skeleton 54 controls the movement of the generic sections 56 and components 58. The design skeleton 60 can control specific vehicle geometry, including the movement and shape of design sections 62 and parametric surfaces 64 based on the requirements of a vehicle design. Configuration library 61 can be used to store information relating to the design skeleton 60. Section library 63 can be used to store information relating to the design sections 62. In certain embodiments, skeletons 54 and 60 share the same set of attachment points, otherwise referred to as control points. Parametric surface library 68 can be used to store information relating to the parametric surfaces 64. Component library 66 can be used to store information relating to the components 58.

Figure 15:
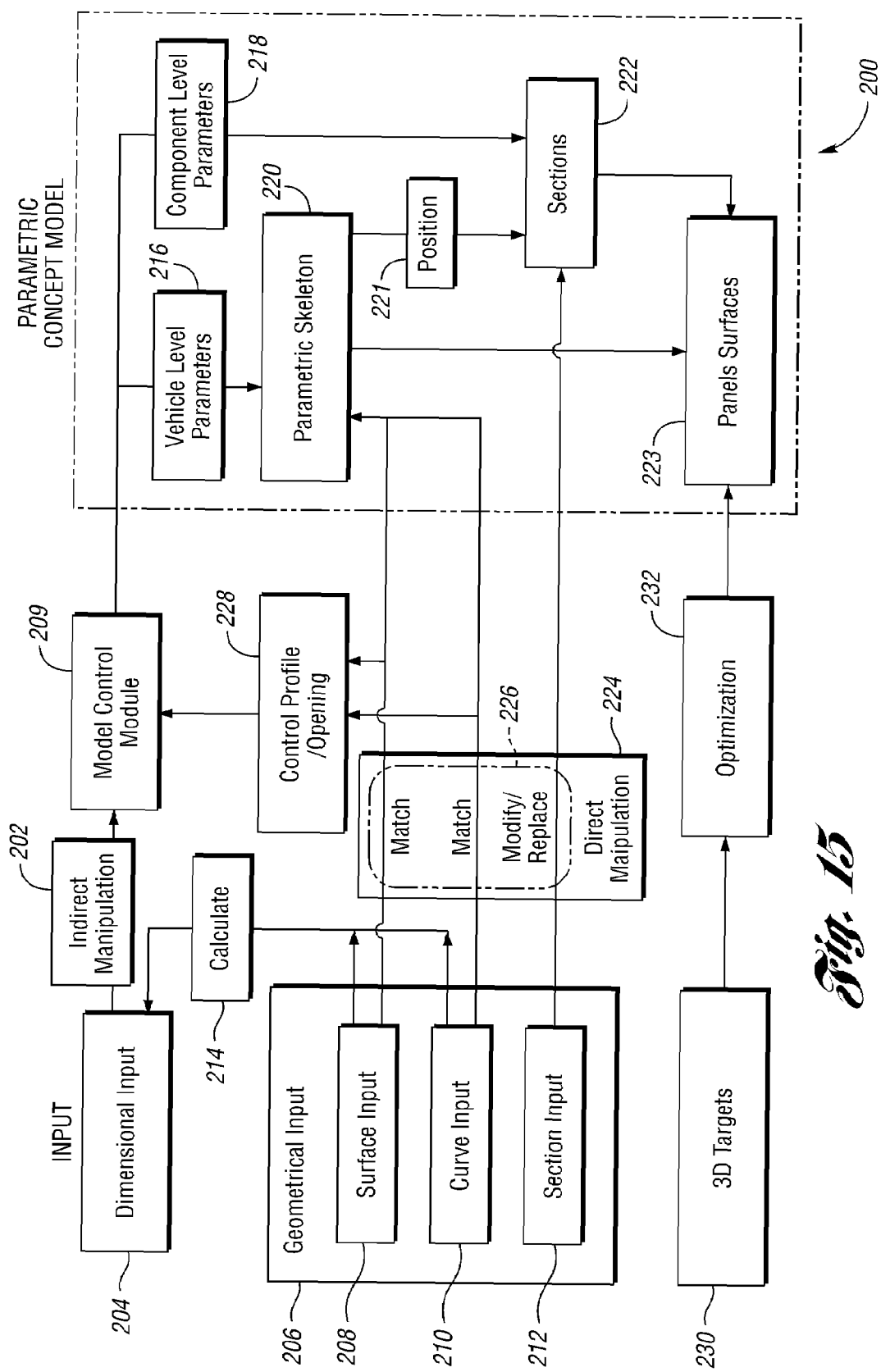
FIG. 15 is a flowchart depicting a manipulation process according to one embodiment of the present invention.

In certain embodiments, parametric model control module 209 of FIG. 15 directly controls skeletons 54 and 60. A number of association rules reside in the control module 209 for manipulating the parametric concept model, which can be otherwise referred to as a vehicle concept model. The control module 209 can be used to generate and translate modifications to the control points and to update to the CAD data file containing the vehicle concept model. Control parameters can be stored in the CAD data file and can be used to update values and calculate changes to the model for the control module 209. In certain embodiments, these parameters are hidden from the user to avoid direct changes to the CAD data file.

In certain embodiments, generic geometry associated with the generic skeleton 54 and vehicle specific geometry associated with the design skeleton 60 are modeled differently because of the different methods used to manipulate them. In certain embodiments, the end user does not change the shape of components 58. The component instances are controlled by control points associated with the generic skeleton 54.

Openings in the generic skeleton 54 can be a set of 3D lines representing the vehicle body opening or typical vehicle cross sections. The openings provide visual guides for users to adjust generic panels matching geometric packaging input.

The design geometry gives users more flexibility to change the model based on design requirements. The modeling architecture includes several layers, e.g. skeleton, sections, beams, joints and panels (listed from upper to lower layers). In certain embodiments, lower layers only reference upper layers to avoid a referencing loop. Thus, the skeletons control the entire model. Sections can be positioned on the skeletons. Beams can be lofted or swept from sections and along skeletons. Joints can be built based on beams. The panels can be built based on skeletons and sections. Design geometry can be managed by an information management system.

In certain embodiments, the association between skeletons 54 and 60 is not actually part of the parametric skeleton 52. In other words, there is no hard coded association in the geometry model, thereby giving the user flexibility to manipulate and design the vehicle concept model.

Accordingly, one or more of the following advantages can be achieved. The user can choose from three modes to modify the vehicle concept model, otherwise referred to as the parametric concept model: (1) the two sets of geometry, including the skeletons, are updated at the same time; (2) iterate the generic geometry without updating the design geometry; and (3) iterate the design geometry without updating the generic geometry.

A template can be created in a CAD system for receiving dimensional and geometrical input (collectively referred to as "the vehicle input") to form the foundation for the parametric concept model. Dimensional input can refer to the dimensional targets and design changes the user desires, including vehicle level dimensions, for example, wheelbase, and component level dimensions, for example, flange lengths. These dimensions can be standardized dimensions, for example, SAE dimensions, or enterprise-defined dimensions. Geometrical input can refer to those design changes that are not described by a set of dimensions. A typical example is the opening curves of a vehicle, for example, door opening curves, windshield or backlight opening curves.

A parametric concept model 100 according to one embodiment of the present invention is depicted in FIG. 3. The parametric concept model 100 includes several layers: (1) a global control layer 112, which includes one or more control parameters 114, and control profiles and opening curves 116; (2) a design skeleton layer 118, which includes control points 120 and control curves 122 passing through control points 120; (3) a design sections layer 124, which can be 2D curves that are placed on a design skeleton at specified locations; (4) a parametric surfaces layer 126, which includes base surfaces 128 and joint surfaces 130; (5) an interior system instances layer 132; (6) a generic skeleton layer 131; and (7) a component layer 135. Surfaces 128 and 130 can be built using one or more sections and following one or more 3D curves defined in one or more design skeletons 118. In certain embodiments, a constraint relationship between the layers of the parametric concept model 100 is defined such that only upper layers can control lower layers to avoid controlling loops.

In addition to the layers described above, four libraries can be established to store reusable geometries, namely, a configuration library 134, a section library 136, a parametric surface library 138, and a component library 140.

Global control layer 112 contains information for controlling the entire model. Global control 112 contains reference geometry which controls or is shared by both generic and design geometry. These geometries include reference points, e.g., SgRP and reference planes such as the YZ plane passing through front SgRP.

Global control 112 can include one or more control parameters 114. Non-limiting examples include SAE parameters and enterprise vehicle parameters.

The control parameters 114 include information for controlling overall vehicle proportions, for example, vehicle length, width, height, as well as other parameters that are used as reference for the vehicle dimensions, for example, the SgRP.

In certain embodiments, control parameters 114 can be used to modify a parametric concept model in three modes: (1) to link one or more geometries directly with one or more parameters, (2) to trigger an external executable based on the change of one or more parameters, which in turn, modifies one or more geometries, and (3) to be stored in a database to serve as the memory of a current state of the model.

These modes can be managed by a control module that determines how to manipulate the vehicle design geometry.

In certain embodiments, the control module has the ability to dynamically switch to any of the three modes, through a "switching mechanism", which enables or disables the dependency of geometry on the control parameters 114.

In certain embodiments, control profiles and opening curves 116 are a set of predefined 2D and 3D geometry, with embedded engineering constraints and relationships, which assist in the manipulation of the parametric concept model. The control profiles and opening curves 116 can be used in at least two different ways: (1) when geometrical input (e.g. opening curves) is available, control profiles and opening curves 116 are used to easily match a model to the input; (2) when geometrical input is incomplete or non-existent, which is common at early design stages, the control profiles and opening curves 116 help the user define the missing geometry.

In certain embodiments, the 2D control profiles 117 are a set of cross sections used to describe an overall topology or configuration of a vehicle, and can be defined in a global vehicle coordinate system. The global X direction of the vehicle coordinate system points from the front of a vehicle towards the rear of the vehicle. The global Y direction points from the center of a vehicle to the right side of the vehicle. The global Z direction points from the ground to the top of a vehicle. The 2D control profiles 117 are vehicle sections taken (1) in the ZX plane at the vehicle center line and (2) in the ZX and YZ plane passing through SgRP, and (3) in the front door, rear door, rear window, windshield, backlight openings projected on ZX and/or YZ planes. Moreover, the control profiles can include engineering requirements associated with SAE and/or enterprise vehicle dimensions.

Figure 4:
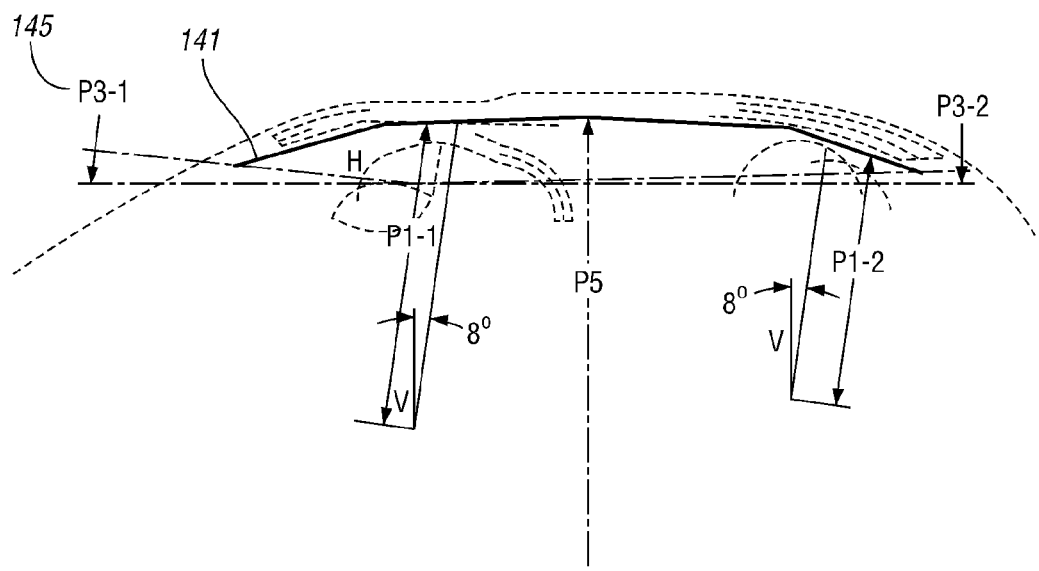
FIG. 4 displays an example of a control profile passing through the driver seating reference point (SgRP) according to one embodiment of the present invention.

FIG. 4 displays an example of a control profile 141 cut at the vehicle ZX plane, passing through the SgRP. The shape of the control profile 141 can be changed by manipulating one or more dimensions 145. The control curve 141 can also be manipulated iteratively. This manipulating capability is especially useful when a desired vehicle profile is specified as the input, thereby allowing for direct manipulation of the profile to match the input.

As illustrated in FIG. 4, the geometric shape of profile 141 is also associated with a set of parametric dimensions, e.g. effective head room, roof height, vision angle to upper windshield daylight opening (DLO), and vision angle to upper backlit DLO. Varying the values of these dimensions changes the shape of the profile 141. Engineers can set these dimensions based on vehicle targets and/or engineering requirements. In either case, the surfaces of the parametric concept model can be updated based on the profile changes.

Figure 5:
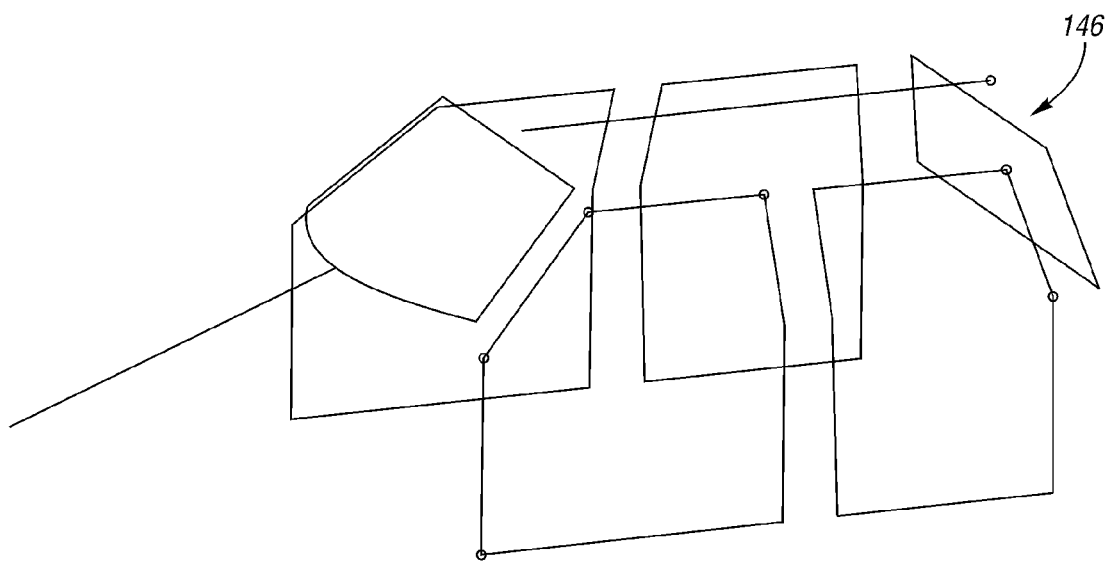
FIG. 5 is an example of the geometric shape of the control openings according to one embodiment of the present invention.

In certain embodiments, 2D control profiles 117 are mostly used for 2D curve input, such as section input. 3D control openings 119 are defined to easily control the spatial curves, for example, door openings. 3D control openings 119 can be simplified representations of the vehicle body openings. The 3D curves with line and arc segments, and/or simple splines can be used to match the input curves. Alternatively, in the case where no input is available, the 3D curves can be used to define the openings. FIG. 5 depicts a number of 3D control openings 146 according to one embodiment of the present invention.

Global control 112 can also include a number of reference points, reference planes and other geometries. Non-limiting examples of reference points include cowl point, front wheel center, rear wheel center, deck point, front SgRP, vehicle highest point, belt line at A-pillar point, belt line at B-pillar point, belt line at C-pillar point, windshield angle point, backlight angle point, A-pillar to rocker point, B-pillar to rocker point, C-pillar to rocker point, quarter panel lower point, hood center front point, and hood side front point. Non-limiting examples of reference planes include YZ plane passing through cowl point, YZ plane passing through front SgRP, and ZX plane passing through front SgRP.

The design skeleton 118 can be a series of control curves 122 that go through control points 120, e.g. 3D points. The design skeleton 118 represents the vehicle architecture and structure. The design skeleton 118 can be modified either by parameters or directly through changes to the control points.

Figure 6:
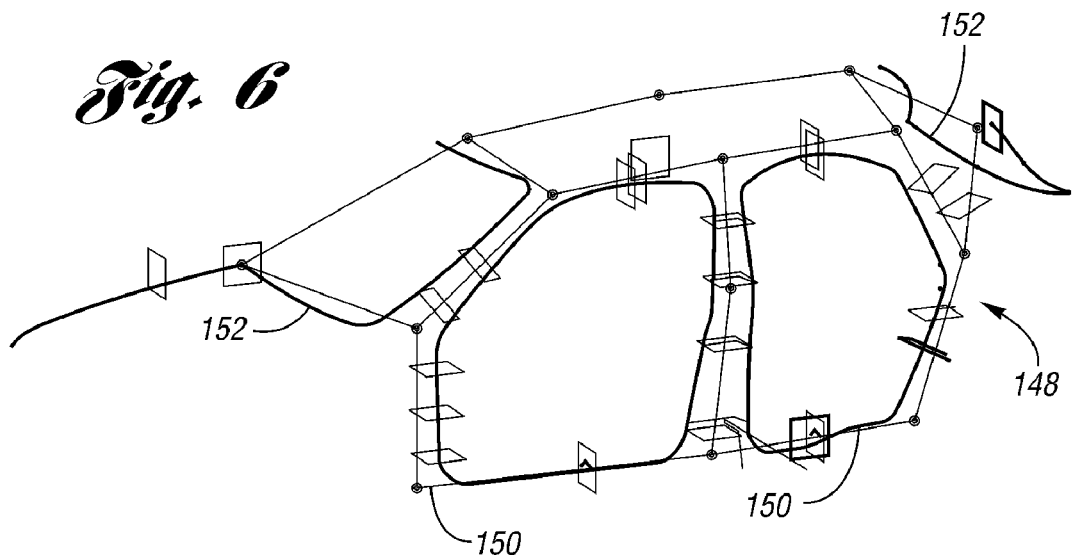
FIG. 6 displays an example of a parametric skeleton according to one embodiment of the present invention.

In certain embodiments, the design skeleton 118 is composed of two types of control curves 122: (1) vehicle level control skeleton curves and (2) opening control skeleton curves. FIG. 6 displays an example of a parametric skeleton 148 including vehicle level control skeleton curves 150 and opening control skeleton curves 152. Vehicle level control skeleton curves 150 are a set of straight line segments, roughly passing through the centers of every pillar type vehicle components, for example, the A-pillar and the rocker. Curves 150 can be used for vehicle level modification, such as the width and height of a vehicle. Opening control skeleton curves 152 are 3D space curves modeled in a series of splines representing vehicle openings, and can be used to control the boundary of one or more components.

The design skeleton 118 can determine the proportion of a vehicle and the position of vehicle design sections. There are at least two ways to represent different configurations using a skeleton 118. For example, all the vehicles share the front portion of the skeleton, with the rear portion varying from car to truck. As a second example, different skeleton templates can be used for different configurations. Using a generic skeleton allows sharing of common geometries for different configurations. Using different skeleton templates for different configurations allows switching from one configuration to another by simply switching to a different template.

Figure 7A:
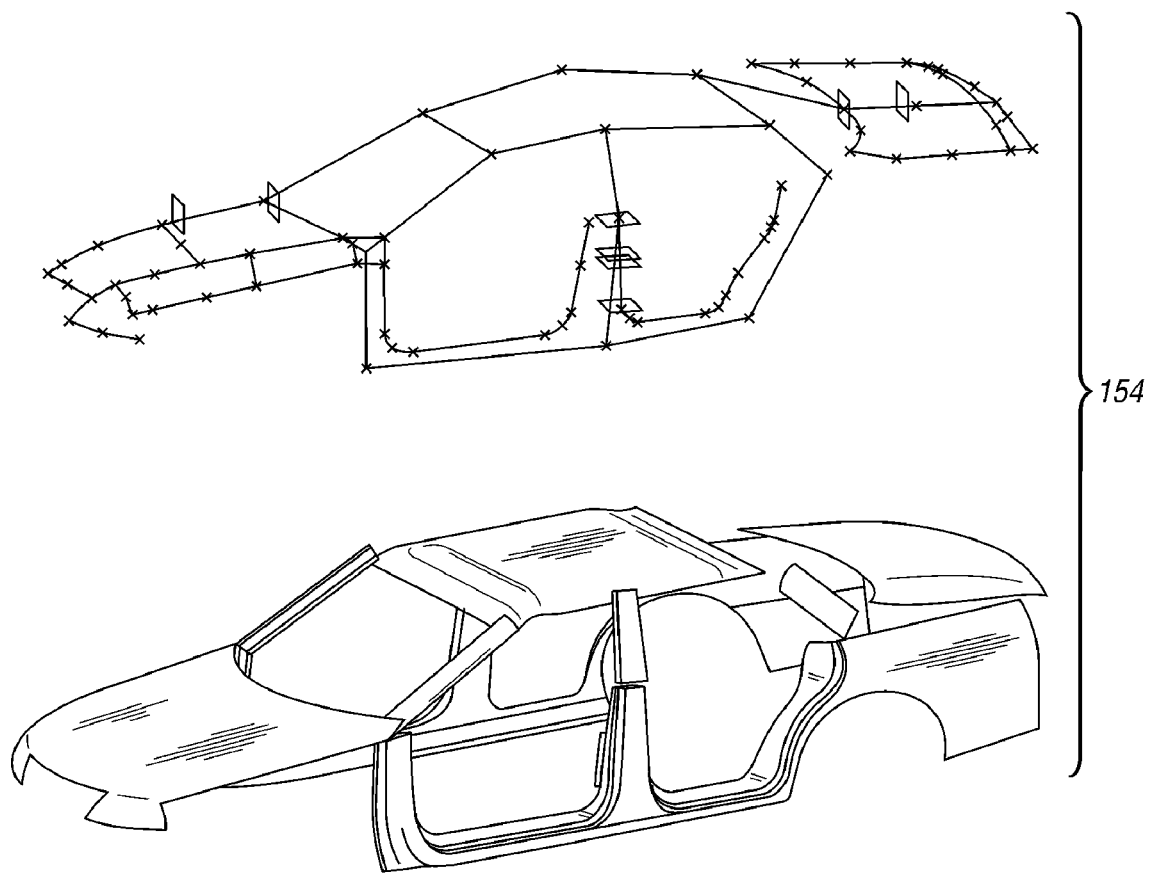
FIGS. 7a and 7b illustrate the representation of different vehicle configurations according to one embodiment of the present invention.
Figure 7B:
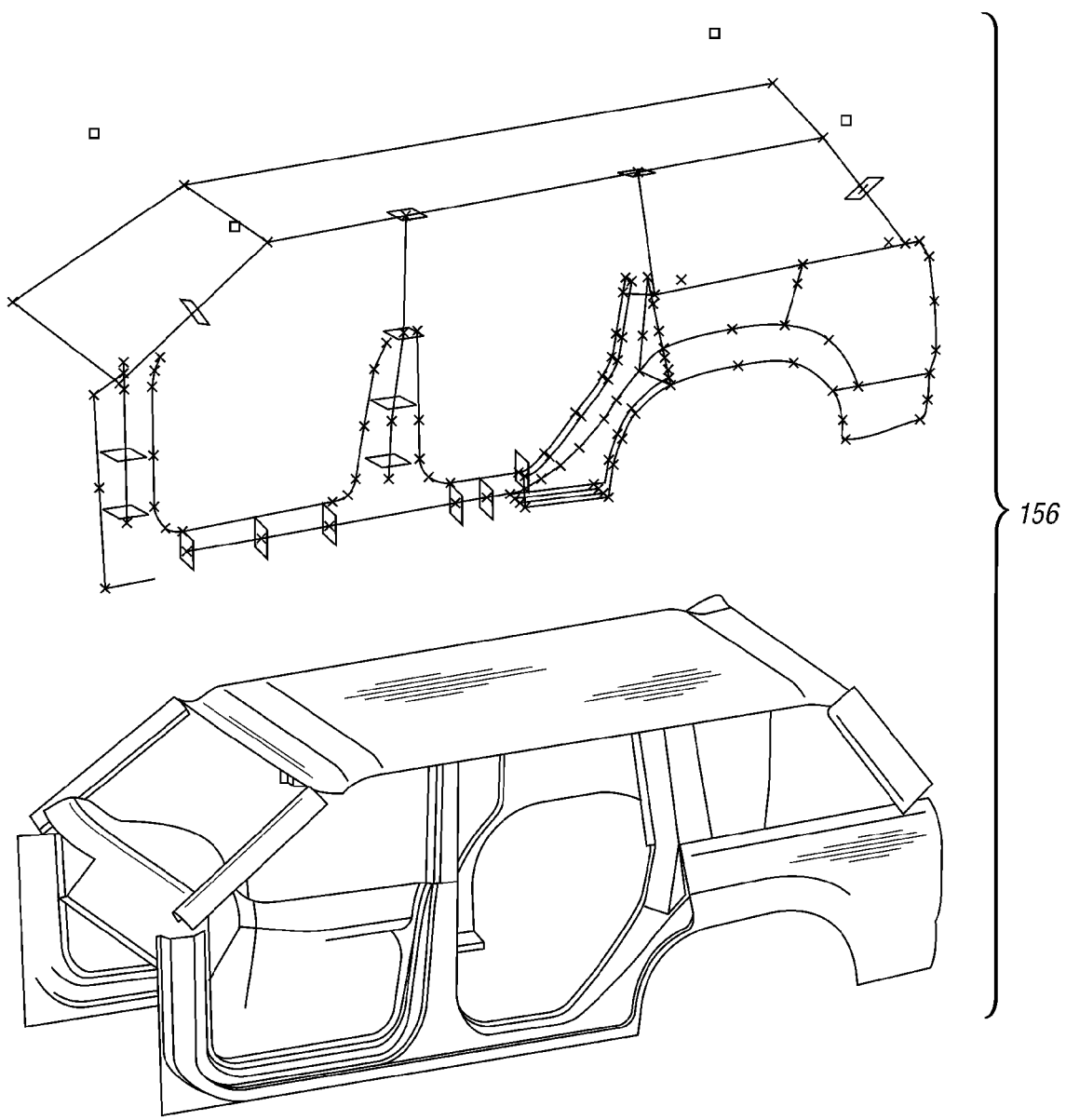

FIGS. 7a and 7b illustrate the comparison of two different vehicle configurations according to one embodiment of the present invention. The configuration 154 of FIG. 7a is a sedan. The configuration 156 of FIG. 7b is a SUV/van.

Design sections 124 can include 2D master sections and other construction sections, which are traditionally cut at specific vehicle locations. Templates can be generated for parametric sections. Non-limiting examples include pillar sections, header sections, roof and roof rail sections, rocker sections, door trim sections, floor and console sections, and hood and decklid sections. The 2D master sections are typically used to specify the design and engineering requirements for a vehicle structure.

Master sections can be represented by a set of parametric sections that are created based on the generic master sections and positioned in the design skeleton at corresponding locations as defined in the vehicle. FIG. 8 illustrates a number of parametric sections located in a skeleton model. Most of the sections describe the cross sections of vehicle components. Some of the sections are profiles for large panel surfaces, for example, the roof and floor.

Master sections can take different shapes and forms for different types of vehicles, for example, a sedan's A-pillar section is sometimes dramatically different from a truck's A-pillar section. Multiple templates can be created to represent various section topologies. FIGS. 9a, 9b, 9c and 9d illustrate four A-pillar section topologies 158, 160, 162 and 164 according to one embodiment of the present invention. In certain embodiments, for each master section, there is only one of the templates used in the parametric concept model, with the rest being stored in the section library 136. For a given design, the section template with the topology that most closely matches the design is selected and placed in the parametric concept model. Then, the size and shape of the section are modified according to the input. Finally, the change update is propagated to downstream geometry.

Figure 10:
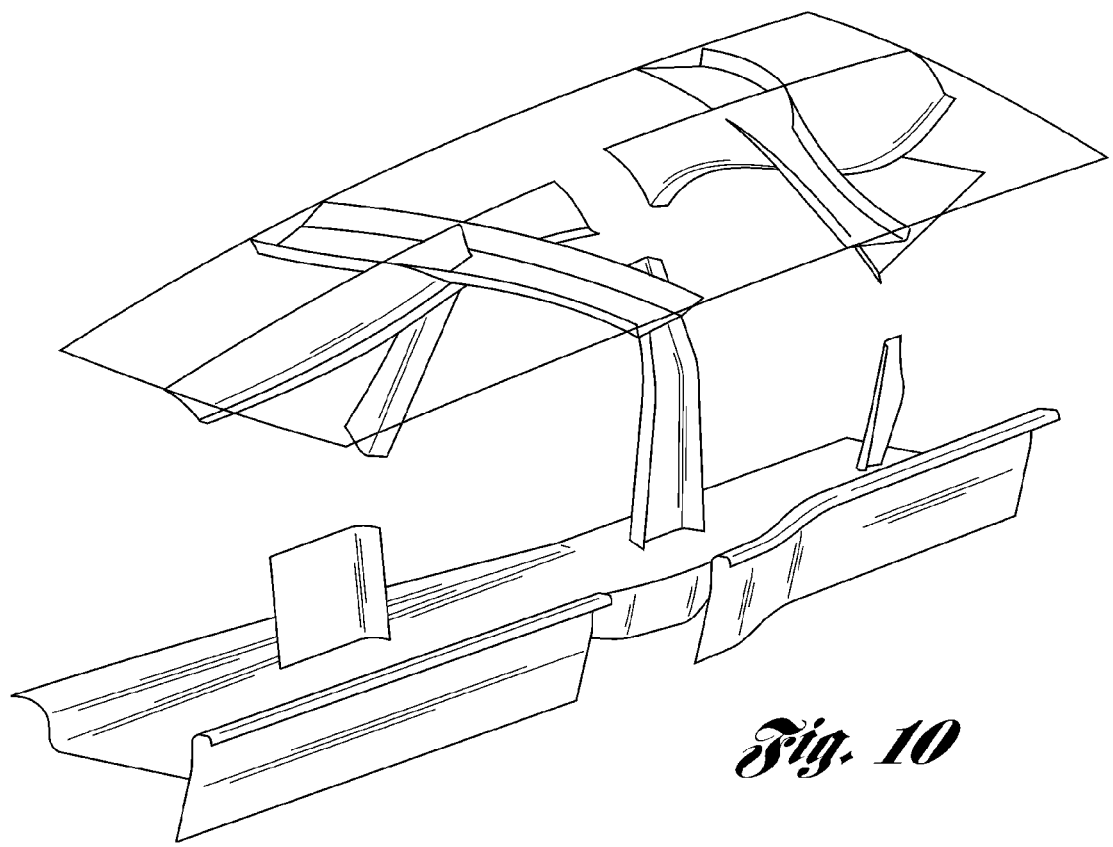
FIG. 10 illustrates an example of base surface modeling according to one embodiment of the present invention.

Base surfaces 128 refer to pillar-type surfaces, such as the A, B and C pillars, roof rail and rockers, as well as large panel surfaces, such as the headliner and floor. Base surfaces 128 can be generated using the sections and other information in the skeleton, and form the bases for downstream geometry. FIG. 10 illustrates an example of base surface modeling according to one embodiment of the present invention.

Basic techniques that may be used to generate base surfaces 128, include, but are not limited to: loft, sweep, and adaptive sweep (CATIA V5) or variational sweep (I-DEAS). CATIA V5 is available from Dassault Systems SA of France. IDEAS is available from UGS Corp. of Plano, Tex. In certain embodiments, the loft operation can efficiently maintain the section characteristics, for example, flange length. For a pillar-type surface, the section can be lofted along two guiding curves in the skeleton. For large panel surfaces, multiple sections can be lofted with two and/or more guiding curves, so that the panel shape can be controlled. For a seamless connection, neighboring surfaces can share the same guiding curves.

The sweep operation allows the modeling of an entire surface with a single section. Advantageously, the sweep operation can automatically adjust the size of the cross section along the guiding curve proportionally to the distance between the guiding curves. If the distance between two guiding curves varies widely, the resultant geometry is often distorted, for example, with a C-pillar surface. In such cases, the adaptive sweep or variational sweep provided by some commercial CAD software allows changes in the size of a section along the sweeping surface based on user-defined requirements.

Figure 11:
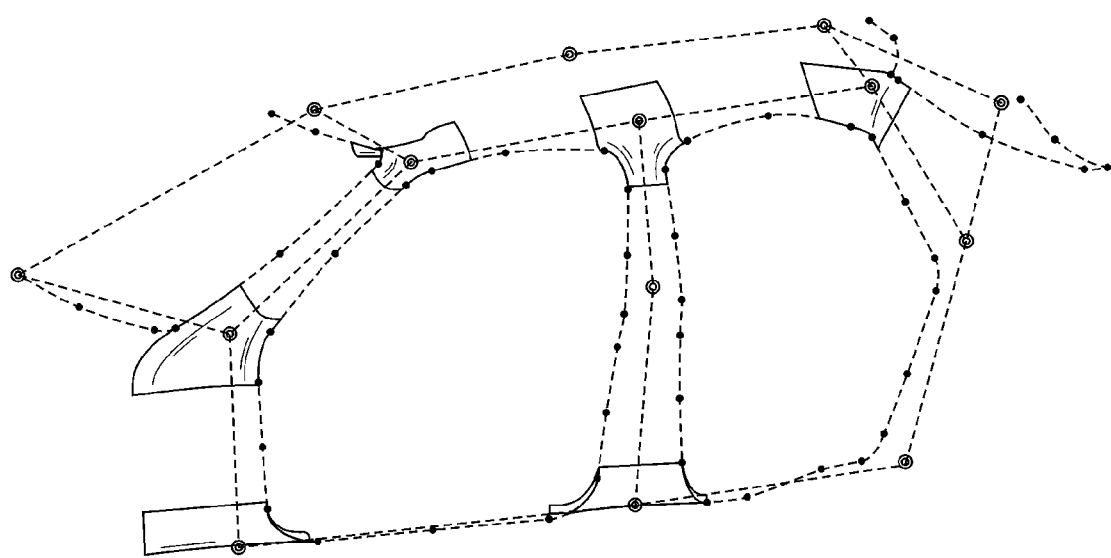
FIG. 11 illustrates an example of joint modeling according to one embodiment of the present invention.

Joint surfaces 130 refer to the area where base surfaces 128 are connected, as shown in FIG. 11. In certain embodiments, certain joints are not editable, and are added manually after other panels finish iterating. Joints can refer to an area where two or more base surfaces are connected. For instance, T-shape joint (e.g. B-pillar to roof connection), an L-shape joint (hinge pillar to rocker), a three-leg joints (e.g. A-pillar to roof joint), or a n-leg joint (e.g. A-pillar at cowl).

There are several methods that can be used to create joint surfaces, including, but not limited to: (1) lofting with guides; (2) extending one base surface, and then trimming and blending into another base surface; (3) using the Junction function provided by some commercial CAD systems, for example, CATIA V5. For a 2-leg joint, for example, the L-joint, the first method may be preferred. The guiding curves are usually obtained from an offset of the control opening curves on the design skeleton.

For 3-leg or T-joints, either the second or third method can be used. Using the A-pillar to roof joint as an example, following the second method, the base surfaces of the A-pillar and the roof side rail is built first. Then, the front header surface is extended and trimmed at the A-pillar and roof-rail base surfaces. Finally, a fillet is added to the trimming boundary. With respect to the third method in certain embodiments, all base surfaces, i.e., A-pillar, front header and roof side rail surfaces, need to be trimmed to the proper length, leaving enough corner space for the joint. Then, all the end sections of the trimmed base surfaces can be connected with the opening curves that define the joint in the design skeleton. Finally, the Junction function is used to generate the joint surface. Additional coupling curves may be added to improve the quality of the joint surface. For n-leg joint, the combination of all three methods is recommended.

Interior system instances 132 contain a set of modularized components for a vehicle interior system, for example, seats, console, steering wheel and column. The systems are integrated as instances in a parametric concept model for various vehicle packaging design and analysis, and are directly placed in the model at specified locations. For instance, a seat can be placed at the SgRP. Most of the interior system instances are controlled in vehicle X, Y and Z directions, for example, the seat up/down, cross-car or fore/aft movements. Others, such as the steering wheel are controlled by linear as well as angular dimensions.

For a parametric concept model, templates and historical data can be stored in libraries to be reused in the future. In certain embodiments, the following libraries are utilized: (1) configuration library 134; (2) section library 136; (3) parametric surfaces library 138; and (4) component library 140.

The configuration library 134 contains skeleton templates for different vehicle types, for example, car, truck, van, etc. Different templates can be used to design different types of vehicles. In addition, the skeletons and surfaces representing local features, e.g. moon roof, can be turned on and off according to the need.

Parametric sections representing generic, historical, and benchmarking design information can be captured in the section library 136. Besides the parametric data that controls the size and shape of the section, each parametric section also requires a set of predefined boundary conditions when instantiated in the parametric concept model. For example, if an A-pillar section is instantiated, the predefined input includes the guiding curves for windshield opening and door opening. This format provides proper insertion of a section onto the skeleton and successful update of the parametric model. Section library can take a different form depending on the tools used. In CATIA, parametric sections can be saved using the User Defined Features or Power Copies command.

Figure 13:
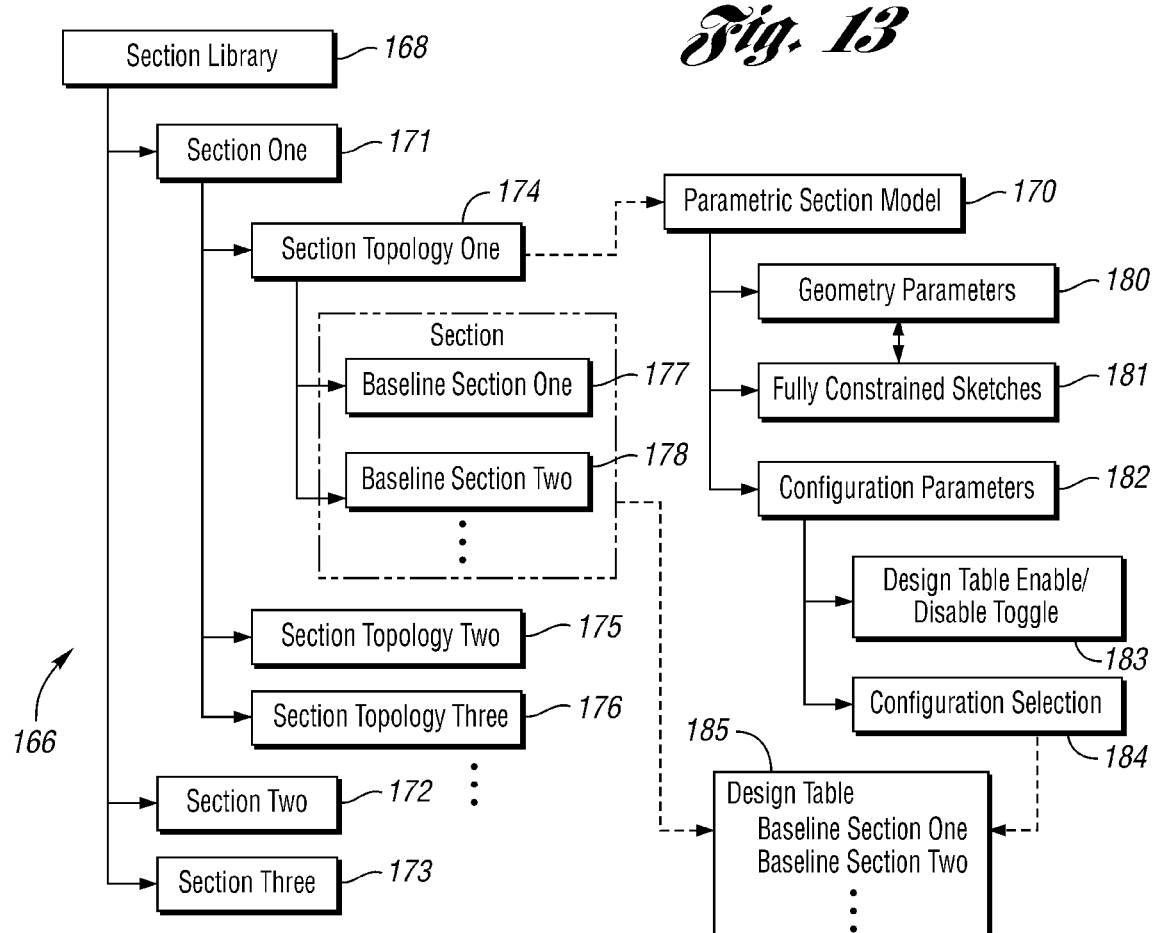
FIG. 13 depicts the structure of a section library according to one embodiment of the present invention.

FIG. 13 depicts the structure 166 of a section library 168 and its relation with a parametric section model 170 according to one embodiment of the present invention. Section library 168 includes, but is not limited to, section one 171, section two 172 and section three 173. Section one 171 includes, but is not limited to, section topology one 174, section topology two 175 and section topology three 176. Section topology one 174 includes, but is not limited to, baseline section one 177 and baseline section two 178. The parametric section model 170 includes geometry parameters 180 (which describes the section geometry), fully constrained sketches 181 and configuration parameters 182. Bi-directional driving can be achieved between geometry parameters 180 and fully constrained sketches 181. The configuration parameters 182 include a design table enable/disable toggle 183 and configuration selection 184. Design table 185 can receive information included in one or more baseline sections and configuration selection 184, such as topologic and parameter values.

Some relatively independent parametric surfaces can be stored in the library 138 and reused in the concept model.

The component library 140 enables reuse of existing design for either commonality requirements or variant design needs. Component library 140 can be populated with different sizes and shapes of components that can be either parametrically defined or static component (non-parametric). To correctly position a component in a concept parametric model, a component datum needs to be established, which may be reference points, reference lines, reference planes and/or angles. For instance, in the case of seats, a seat datum is a seating reference point and the seat back angle parameter relating to the reference line.

Figure 14:
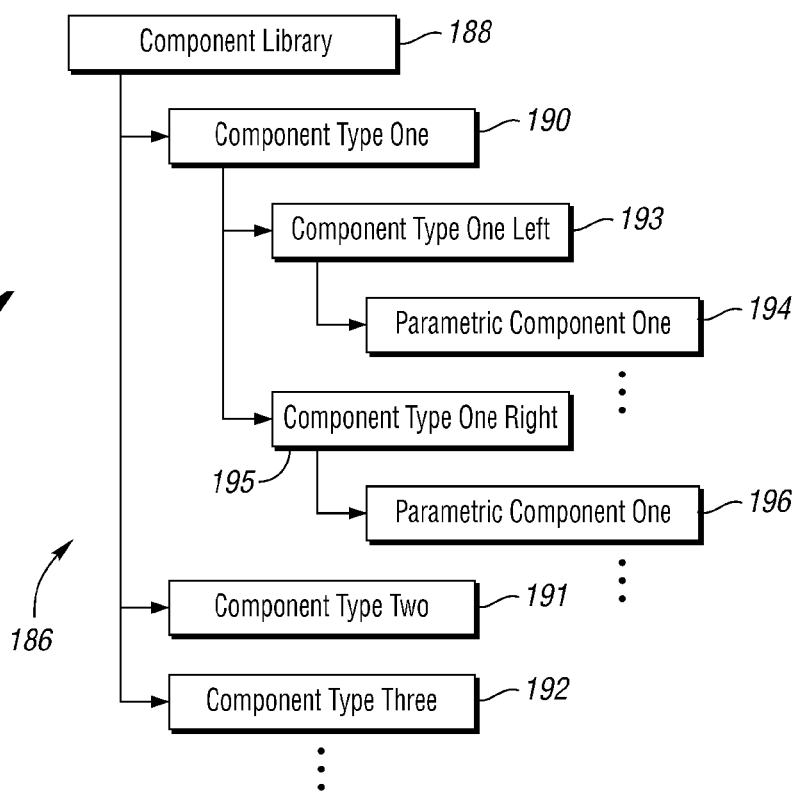
FIG. 14 depicts the structure of a component library according to one embodiment of the present invention.

FIG. 14 depicts the structure 186 of a component library 188 according to one embodiment of the present invention. Component library 188 includes, but is not limited to component type one 190, component type two 191 and component type three 192. Component type one 190 further includes, but is not limited to, one component type one left 193, which includes, but is not limited to, parametric component one 194 and component type one right 195, which includes, but is not limited to, parametric component one 196.

In certain embodiments, smart geometry can be used in association with the parametric concept made. Smart geometry can refer to the geometry that contains knowledge rules. When conditions change during modifications, the smart geometry is able to automatically adjust itself to prevent updating failure or to improve the quality of the surface.

Figure 12:
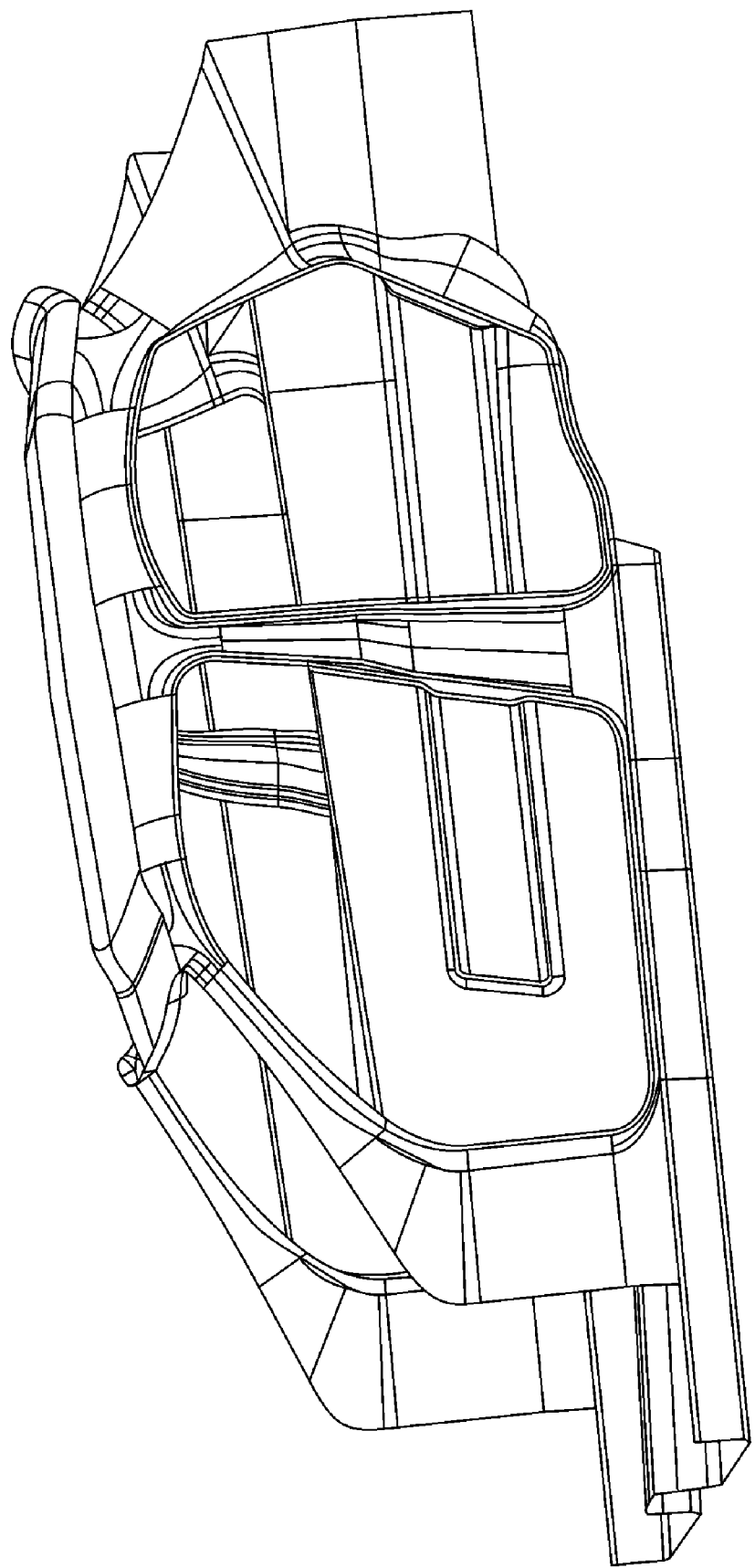
FIG. 12 displays an example of a number of parametric concept surfaces according to one embodiment of the present invention.

Parametric concept surfaces are the surfaces that can be created following the above described vehicle concept modeling method. FIG. 12 displays an example of a number of parametric concept surfaces according to one embodiment of the present invention. To generate vehicle component surfaces, the concept surfaces may be stitched together and/or may be decomposed into components at designed positions. For the vehicle interior packaging study, the concept surfaces are sufficient. In order to fabricate physical trim panels, stitching and decomposition may be required.

The parametric vehicle concept model created using the method described above can be easily adjusted to match different input either automatically or manually. In certain embodiments, two methods can be used to manipulate the parametric geometry: indirect and direct manipulation. FIG. 15 is a flow chart 200 depicting an indirect and direct manipulation process according to one embodiment of the present invention.

Indirect manipulation 202 of a parametric concept model refers to the use of dimensions to drive changes in the model. The dimensions can be taken directly from dimensional input, e.g. SAE dimensions and/or targets, which can be entered by a user through a graphical user interface. Alternatively, the dimensions can be calculated from a portion of geometrical input 206, e.g. surface input 208 and/or curve input 210, as depicted by block 214. The surface input 208 can be received as surface scan CAD data. The curve input 210 can be received from a 2D vehicle representation CAD file. Through the indirect manipulation process, the dimensional input 204 is transmitted to the model control module 209, which controls parametric skeleton 220 or sections 222.

In certain embodiments, there are two kinds of indirect parameter manipulations depending on the type of dimensions used: (1) vehicle level 216, and (2) component level 218. Vehicle level parameter manipulation 216 affect the parametric skeleton 220, and are handled at the skeleton level. Since the skeleton 220 is the root of all other parametric geometry, changes at the vehicle level will trigger the cascade of design changes at a lower level. For example, design manipulations of the skeleton affecting the position 221 of sections 222 cascade down to sections level 222. Component level design manipulation occurs at the sections level 222 by changing section parameters. In certain embodiments, the section changes may only affect neighboring beams and joints. Design changes at the parametric skeleton level 220 and sections level 222 cascade down to the panels surface level 223.

In certain embodiments, the vehicle level parameters 216 refer to a set of standard SAE vehicle dimensions, e.g. vehicle length, height, wheelbase, windshield angle, tumblehome and seating reference point, and/or a set of enterprise design parameters that are non-SAE dimensions. Since the parametric constraint relationship has already been established inside the skeleton, by modifying these dimensions, the skeleton can be stretched and reshaped accordingly. This method can be used as the first step in adjusting the parametric concept model to achieve overall vehicle proportions.

In certain embodiments, the constraint relationship in the skeleton model is set such that the change of each vehicle level dimension corresponds to the movements of a set of control points in the skeleton. When the control points move to new positions in space, the skeleton is changed accordingly. Once the skeleton is adjusted, the guiding curves are changed and the corresponding sections on the skeleton moved to new locations. Finally, all affected surfaces (base surfaces, joints and panels) are updated to achieve the design changes.

Component level parameter changes 218, for example, changes to an A-pillar's size and shape, can be achieved in two steps: (1) selecting a section template with the closest topology to the new design; and (2) modifying the parameters defined for the section to match the input requirements. Once the initial geometry is settled, more changes may be made during the design iteration where trade-offs are performed.

Figure 16:
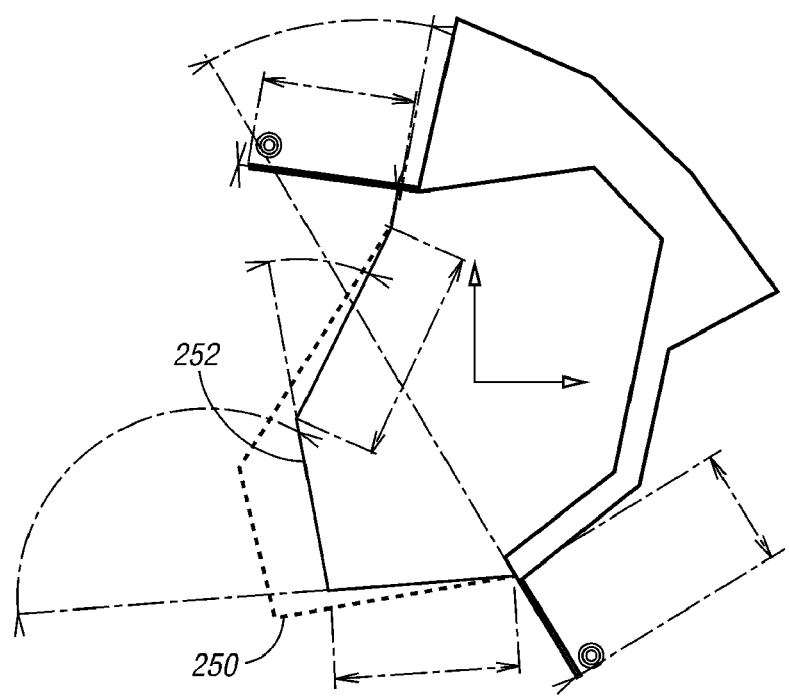
FIG. 16 illustrates an example of an A-pillar shape change using component level parameter changes according to one embodiment of the present invention.

FIG. 16 illustrates an example of an A-pillar's shape change using component level parameters 218. The depth of the A-pillar inner section is modified from line 250 to line 252 by modifying the depth parameters, while other parameters, such as flange widths remain unchanged.

The direct manipulation method 224 refers to the use of geometrical input including surface input 208, curve input 210 and section input 212, to directly modify the parametric model in order to match a given vehicle style or panel and component shape. The section input 212 can be input from parametric construction sections ("PCS"), i.e. historical or benchmarking sections built in CAD. In addition, the section input can be input from historical vehicle design.

The direct manipulation can be carried out with the help of 2D control profiles or 3D control openings. It can be achieved either manually by dragging the control points in the skeleton or automatically using geometric reasoning.

According to circle 226 and block 228, 2D control profiles can be parametrically associated with the parametric surfaces in the skeleton and can be used to match the 2D input when available. After 2D profiles are matched with the input, the parametric concept model can be updated accordingly. An advantage of using the 2D control profiles is that the manipulation can be achieved with incomplete geometrical input, because the 2D profiles are also associated with engineering requirements that can provide necessary default or best practice data. The use of 2D profiles is ideal for matching section types of input.

Two methods can be used to match space curve types of input using 3D openings: (1) using 3D control openings; and/or (2) directly adjusting the control points in the skeleton.

3D openings are first used for a rough match of the model to a 3D geometry input, then they are adjusted either manually or automatically to better fit the input curves. To fine-tune the model, the control points on the 3D control openings in the Global Control or in the open control skeleton may be directly modified according to the input that can be the vehicle exterior surfaces or package opening curves, such as the door opening lines.

According to block 230, 3D targets, for example, zones and cones or other generic boundary constraints, can be included in the model. Panel surfaces 223 can be optimized using 3D targets 230, as depicted in 232.

Figure 17:
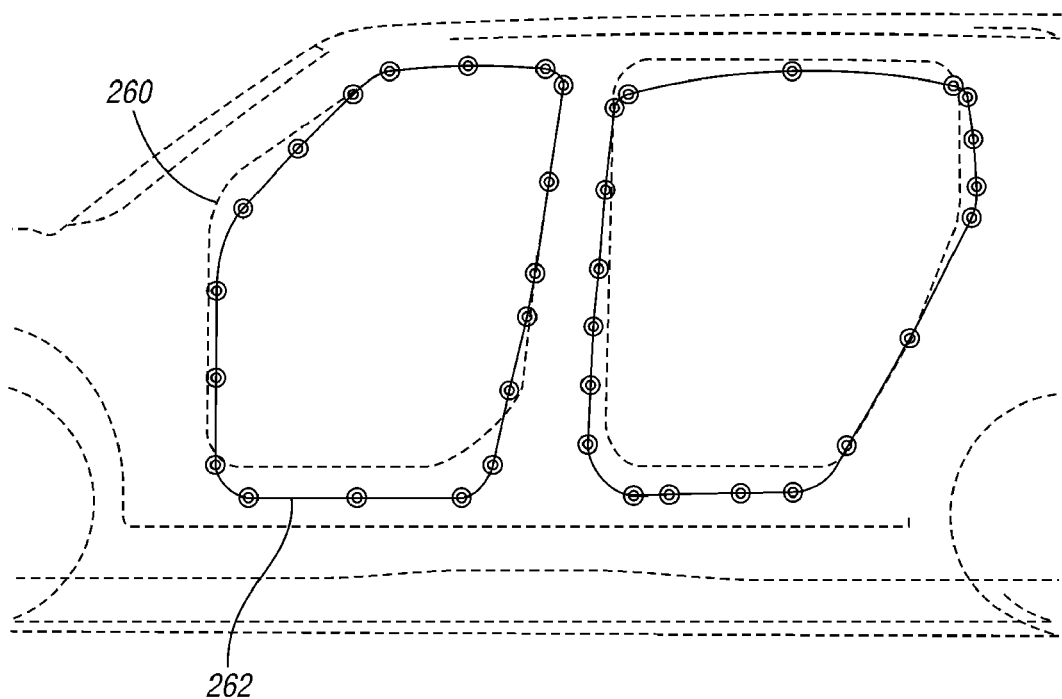
FIGS. 17 and 18 illustrate an example of skeleton and curve matching according to one embodiment of the present invention.
Figure 18:
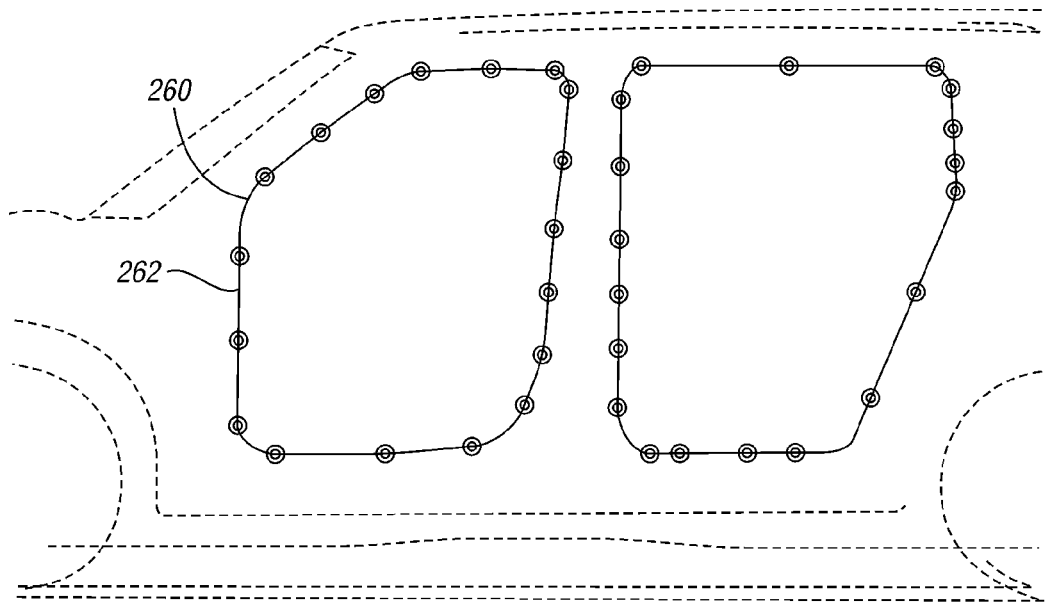

In the example shown in FIG. 17 (before) and FIG. 18 (after), the opening control skeleton curves representing the front door opening curves 262 are automatically matched to the input curves 260 by repositioning the control points that the 3D opening pass through.

Figure 19:
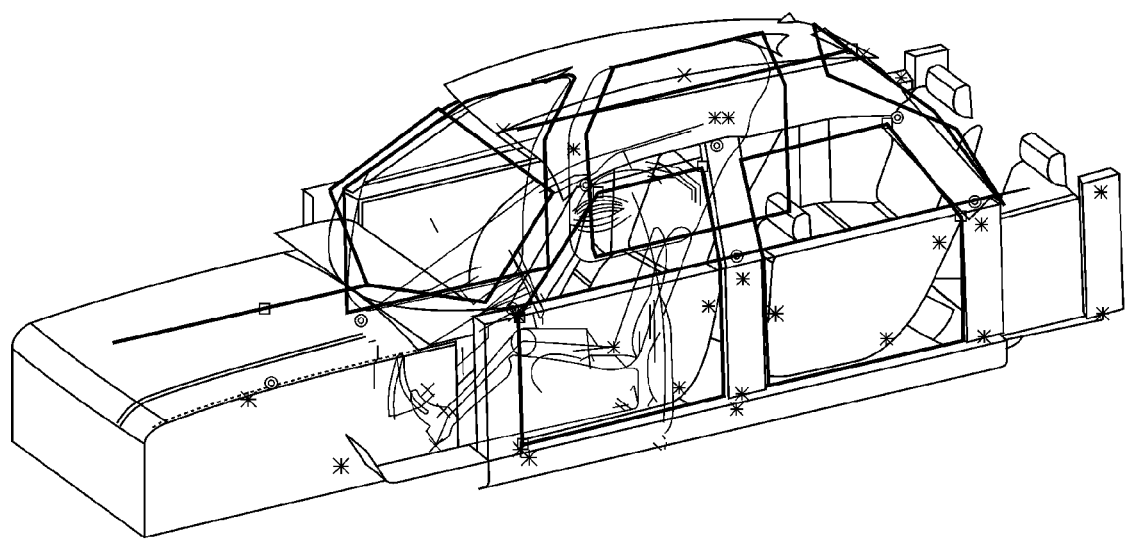
FIG. 19 illustrates an example of a model having generic components based on a generic skeleton according to one embodiment of the present invention.

FIG. 19 illustrates an example of a model having components based on a generic skeleton according to one embodiment of the present invention.

FIG. 20 illustrates an example of a parametric concept model 270 produced using the parametric modeling method according to one embodiment of the present invention. The model 270 can be identified parametrically using SAE and enterprise vehicle dimensions gathered through a graphical user interface (GUI), and matched to the package input represented by curves and door openings. FIG. 21 illustrates an example of a GUI for modifying the vehicle level parameters, for example, SAE dimensions.

As required, detailed embodiments of the present invention are disclosed herein. However, it is to be understood that the disclosed embodiments are merely exemplary of an invention that may be embodied in various and alternative forms. Therefore, specific functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed:

1. An electronic method for parametric modeling of a conceptual vehicle design, the method comprising the steps of:
   (a) receiving dimensional input including one or more vehicle level parameters and one or more component level parameters;
   (b) receiving geometrical input including one or more non-dimensional design inputs; and
   (c) generating a parametric concept model based on the dimensional input and the geometrical input, wherein the parametric concept model includes a parametric skeleton having one or more control profiles and one or more control openings associated therewith; and
   (d) adjusting the one or more control profiles or the one or more control openings to modify the parametric concept model;
   (e) generating a generic skeleton, having generic geometry associated therewith, based on the parametric skeleton;
   (f) generating a design skeleton, having vehicle specific geometry associated therewith; and
   (g) either iterating the generic skeleton without updating the design skeleton or iterating the design skeleton without updating the generic skeleton.

2. The electronic method of claim 1 wherein the one or more control profiles are two dimensional and the one or more control openings are three dimensional.

3. The electronic method of claim 1 further comprising:
   (h) repeating step (b) to obtain updated geometrical input; and
   (i) updating the parametric concept model based on the dimensional input, the geometrical input and the updated geometrical input.

4. The electronic method of claim 2 wherein the geometrical input includes one or more of the inputs selected from the group consisting of: surface input, curve input and section input.

5. The electronic method of claim 4 further comprising:
   (h) manipulating the section input to obtain the one or more sections.

6. The electronic method of claim 2 wherein step (c) is comprised of:
   (c1) generating the parametric skeleton based on the one or more vehicle level parameters; and
   (c2) generating sections based on the one or more component level parameters.

7. The electronic method of claim 1 wherein the one or more vehicle level parameters is a wheelbase.

8. The electronic method of claim 1 wherein the one or more component level parameters is a flange length.

9. The electronic method of claim 1 wherein the dimensional input are SAE dimensions or enterprise-defined dimensions.

10. The electronic method of claim 1 wherein at least a portion of the dimensional input comprises one or more control parameters.

11. The electronic method of claim 10 wherein step (c) comprises:
   (c) controlling the geometrical input with the one or more control parameters to generate the parametric concept model.

12. An electronic method for parametric modeling of a conceptual vehicle design, the method comprising the steps of:
   (a) receiving dimensional input and geometrical input; and
   (b) generating a parametric skeleton based on the dimensional input and the geometrical input, wherein the parametric skeleton is relied upon to generate a parametric concept model, wherein the parametric skeleton includes one or more control profiles and one or more control openings associated therewith; and
   (c) adjusting the one or more control profiles or the one or more control openings to modify the parametric concept model;
   (d) generating a generic skeleton, having generic geometry associated therewith, based on the parametric skeleton:
   (e) generating a design skeleton, having vehicle specific geometry associated therewith, including control curves passing through control points, based on the parametric skeleton, wherein the control curves include both vehicle level control skeleton curves and opening control skeleton curves; and
   (f) either iterating the generic skeleton without updating the design skeleton or iterating the design skeleton without updating the generic skeleton.

13. The electronic method of claim 12, wherein the generic skeleton and the design skeleton share a number of control points.

14. The electronic method of claim 12, wherein the design skeleton includes specific vehicle geometry.

15. The electronic method of claim 12, further comprising:
   (g) manipulating the parametric concept model by (1) repositioning one or more components in the generic skeleton and/or (2) updating or regenerating one or more parametric surfaces governed by the design skeleton.

16. A computer system including a computer having a central processing unit (CPU) for executing machine instructions and a memory for storing machine instructions that are to be executed by the CPU, the machine instructions when executed by the CPU implement the following functions:
   (a) receiving dimensional input and geometrical input;
   (b) generating a parametric skeleton based on the dimensional input and the geometrical input, wherein the parametric skeleton is relied upon to generate a parametric concept model, and wherein the parametric skeleton includes one or more control profiles and one or more control openings associated therewith;
   (c) adjusting the one or more control profiles or the one or more control openings to modify the parametric concept model;
   (d) generating a generic skeleton, having generic geometry associated therewith, based on the parametric skeleton;
   (e) generating a design skeleton, having vehicle specific geometry associated therewith, including control curves passing through control points, based on the parametric skeleton, wherein the control curves include both vehicle level control skeleton curves and opening control skeleton curves; and
   (f) either iterating the generic skeleton without updating the design skeleton or iterating the design skeleton without updating the generic skeleton.

* * * * *

UNITED STATES PATENT AND TRADEMARK OFFICE
CERTIFICATE OF CORRECTION

PATENT NO. : 7,647,210 B2  Page 1 of 1
APPLICATION NO. : 11/276234
DATED : January 12, 2010
INVENTOR(S) : Wang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 286 days.

Signed and Sealed this

Twenty-eighth Day of December, 2010

David J. Kappos
*Director of the United States Patent and Trademark Office*